United States Patent [19]

Carp et al.

[11] Patent Number: 4,745,373
[45] Date of Patent: May 17, 1988

[54] METHOD AND STRUCTURE FOR SYNTHESIZING $2^C$ HZ FROM A $2^A.5^B$ HZ OSCILLATOR

[75] Inventors: Stuart L. Carp, Menlo Park; William P. Cornelius, Sunnyvale, both of Calif.

[73] Assignee: Hewlett-Packard Company, Palo Alto, Calif.

[21] Appl. No.: 67,655

[22] Filed: Jun. 26, 1987

[51] Int. Cl.$^4$ .............................................. H03L 7/18
[52] U.S. Cl. ........................................ 331/16; 331/25
[58] Field of Search .................... 331/16, 25; 455/260; 375/81, 120

[56] References Cited

U.S. PATENT DOCUMENTS 4,434,696  3/1984  Conviser ........................ 331/51 X Primary Examiner—Eugene R. LaRoche
Assistant Examiner—David Mis
Attorney, Agent, or Firm—Bradley A. Perkins

[57] ABSTRACT

A method and structure is provided for phase locking an output signal having, for example, a desired frequency of $2^C$ Hz with a reference signal having a frequency of $2^A.5^B$ Hz. The phase comparison is performed at a high frequency in order to minimize phase noise and spurious signals.

22 Claims, 8 Drawing Sheets

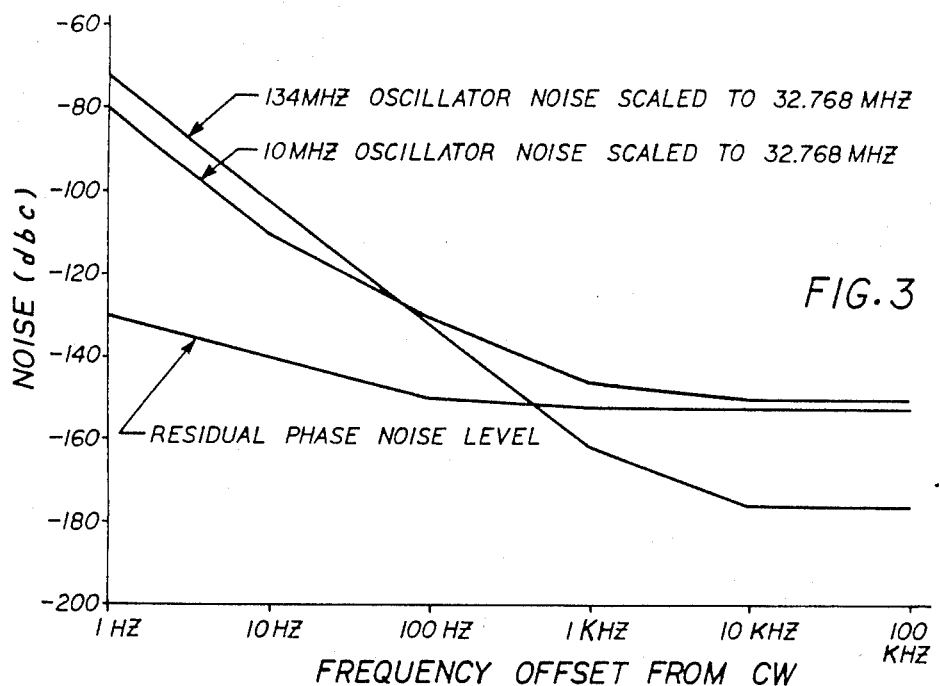
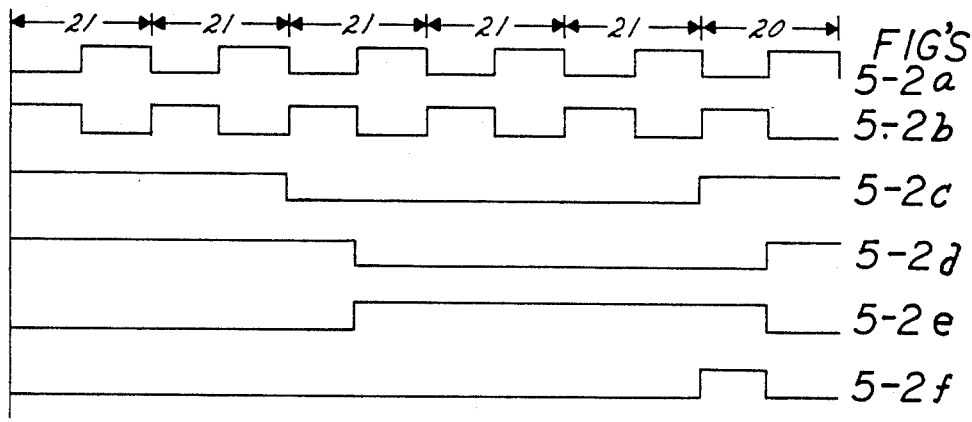
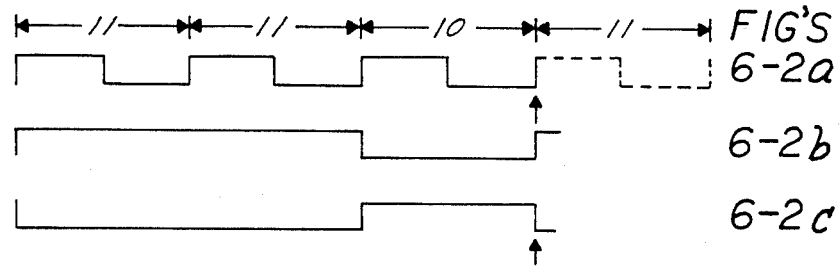

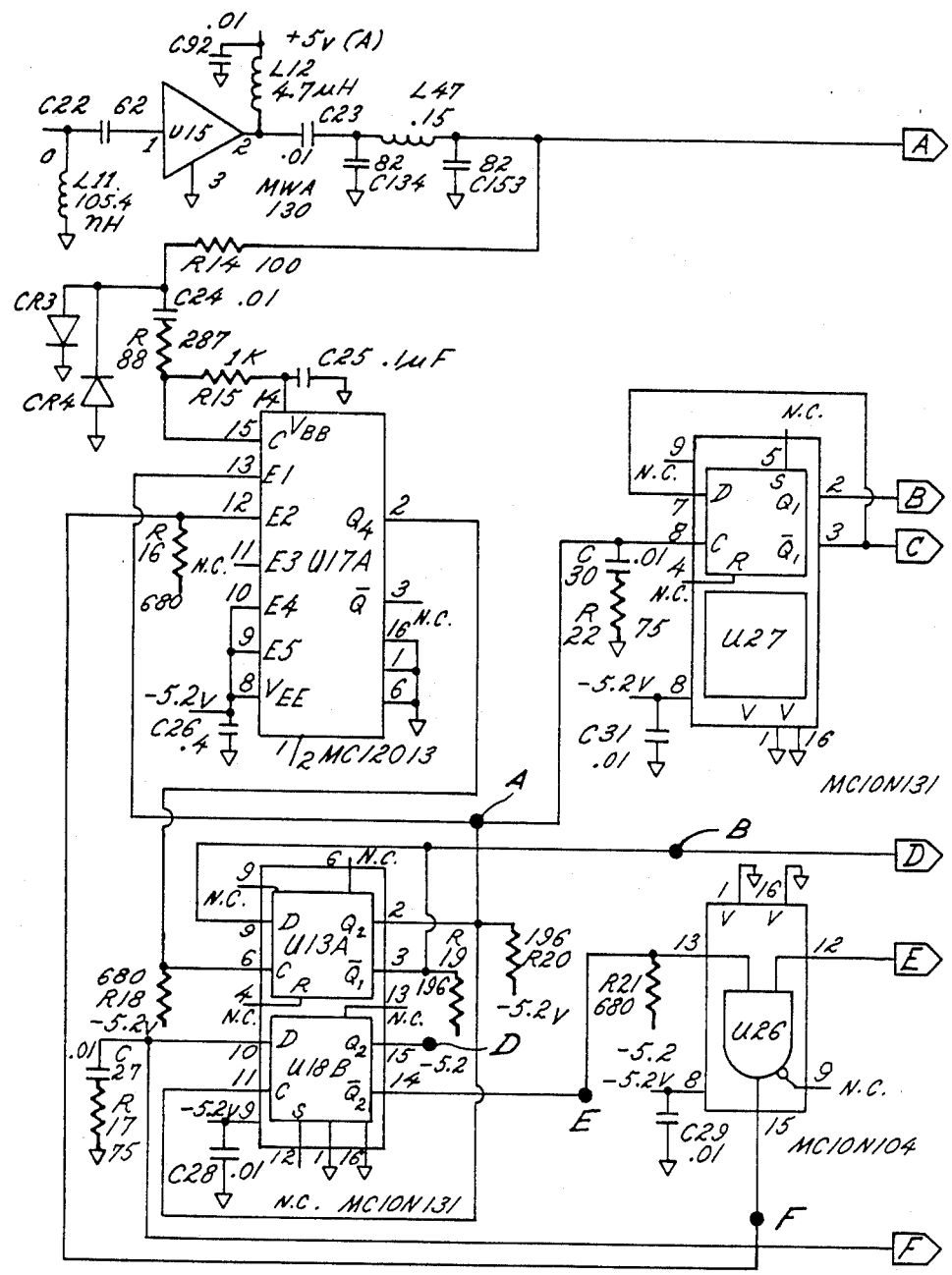
FIG. 5-1 1 OF 2

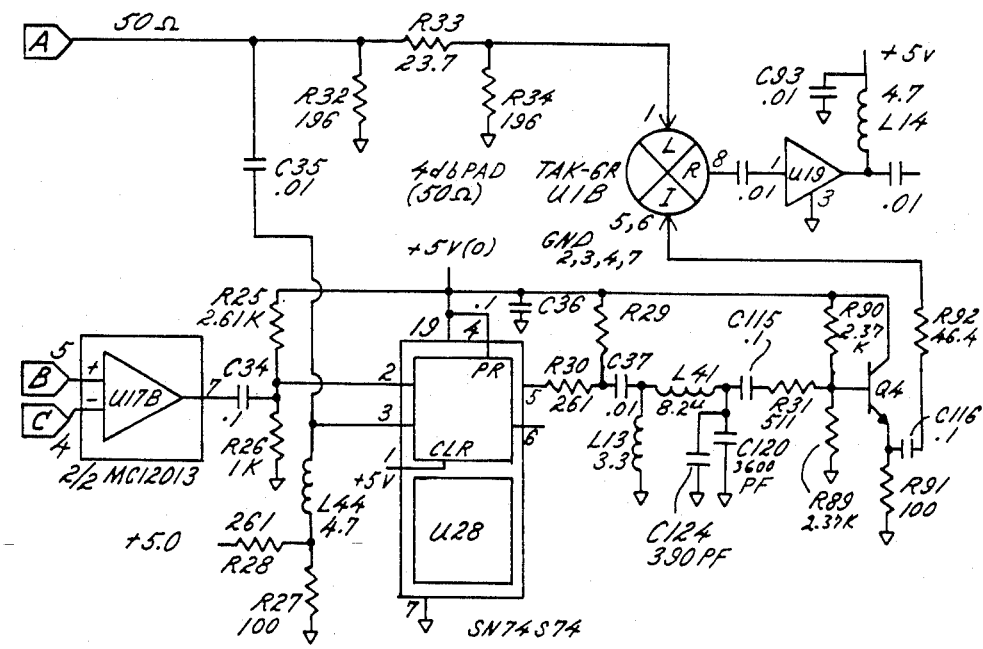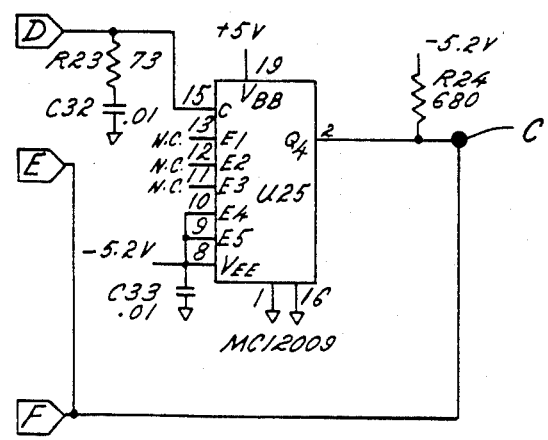
FIG 5-1 2 OF 2

1 OF 2

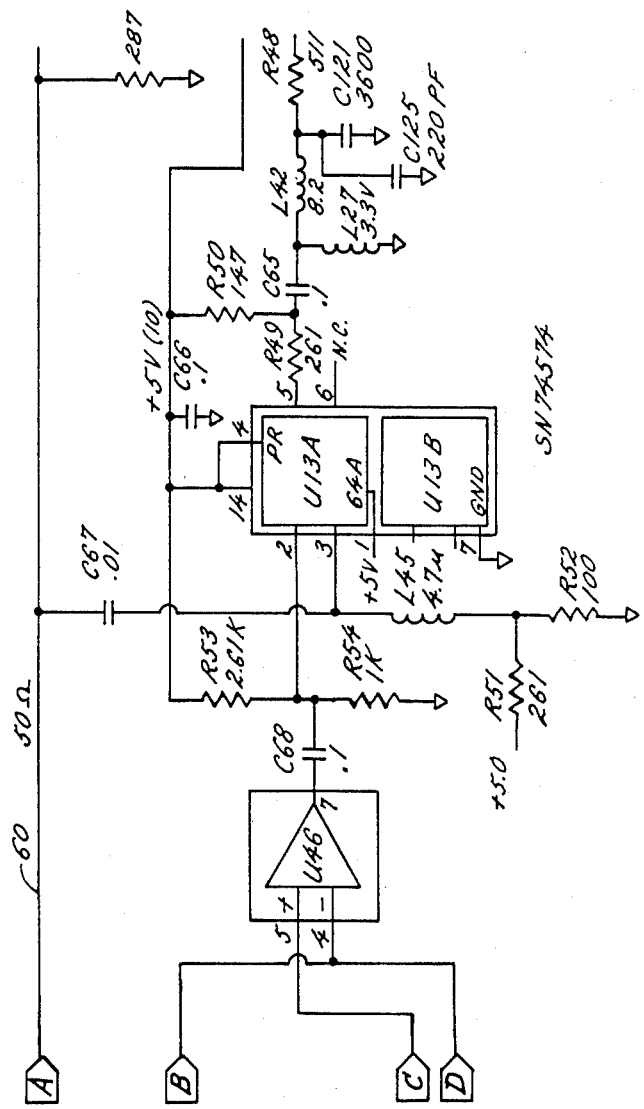
FIG 6-1 2 OF 2

METHOD AND STRUCTURE FOR SYNTHESIZING $2^C$ HZ FROM A $2^A \cdot 5^B$ HZ OSCILLATOR

BACKGROUND OF THE INVENTION

This invention relates to signal generation, and in particular to a novel means and structure for generating a signal having a frequency of $2^C$ Hz from a reference signal having a frequency of $2^A \cdot 5^B$ Hz.

It is often desired to generate or "synthesize" signals having desired frequencies. Various techniques for doing so are well known in the art. However, when it is desired to generate an output frequency which is highly stable and highly accurate, a relatively few signal generation techniques are available. To generate highly stable and accurate signals, a crystal, such as a quartz crystal, can be used in an oscillator circuit. The signal from the crystal oscillator circuit can either be used as is, or can be multiplied in order to obtain a reference signal having a frequency greater than the fundamental frequency of the crystal. Another technique is to use a phase lock loop in order to generate a highly stable and accurate frequency which is other than the frequency of the crystal element in the phase lock loop circuit. More complex techniques are also available, including direct frequency synthesis and the like, as is well known in the art. Such various frequency generation techniques are described, for example, by Noordanus, "Frequency Synthesizers—A Survey of Techniques", IEEE Transactions on Communication Technology, Vol. COM-17, No. 2, April 1969, pp. 257–271, which is hereby incorporated by reference.

In certain applications, such as direct digital frequency synthesis, it is highly advantageous to have a reference signal having a frequency which is an integral power of two. Such a signal could be generated using a crystal having an appropriate frequency, although there are several major disadvantages to this. One is that for a frequency of $2^C$ Hz, with C=27 (134.217728 MHz), crystal oscillators are not highly stable, and thus drift in frequency over time. Secondly, their close-in phase noise is not as low as that provided by a lower frequency oscillator (such as 10 MHz). It would be highly advantageous, therefore, to provide such a signal having a frequency of $2^C$ Hz which is derived from a signal having a more common frequency, such as 5 MHz, 10 MHz, etc., since circuits employing such reference oscillators are well known in the art and widely used, exhibit high stability, low close-in phase noise, and are easily calibrated. 10 MHz can be expressed as $2^A \cdot 5^B$, where A=B=7.

One technique for performing this function in accordance with the prior art is to provide a phase lock loop circuit, as is shown in FIG. 1. Phase lock loop circuit 10 of FIG. 1 includes a 10 MHz reference signal source 11, as is well known in the art. Phase lock loop circuit 10 also includes voltage controlled oscillator (VCO) 14 which provides an output signal on output terminal 19 having a desired frequency. If this frequency is equal to $2^{27}$ Hz (134,217,728 Hz), it is seen that 128 Hz is the greatest common factor of the 10 MHz reference signal provided by reference signal source 11 and the $2^{27}$ Hz desired output signal to be generated by VCO 14, since 10 MHz equals $2^7 \times 5^7$ Hz and $128 = 2^7$ Hz. Thus, in accordance with general phase lock loop techniques, it is necessary to provide a 128 Hz signal derived from the 10 MHz signal generator 11 to phase comparator 13, for comparison with a 128 Hz signal derived from VCO 14. In order to do this, the 10 MHz signal from signal generator 11 must be divided by a factor of $5^7$ by divider 12, and the output signal from VCO 14 must be divided by a factor of $2^{20}$ by divider 15. Means for dividing a signal by 2, (and thus powers of 2) and by 5, (and thus by powers of 5) are well known in the art. By applying two signals from dividers 12 and 15 to phase comparator 13, phase comparator 13 is able to generate an error signal which is applied to loop filter/amplifier 9, which in turn provides a signal to the control input lead of VCO 14 in order to control the output frequency of VCO 14. Thus, if the frequency of the output signal from VCO 14 is greater than the desired output frequency, phase detector 13 will provide an error signal so indicating, causing VCO 14 to lower its frequency. Conversely, should VCO 14 provide an output signal whose frequency is less than desired, phase detector 13 will provide an error signal to VCO 14, causing VCO 14 to increase its frequency. In this manner, a loop is established which phase locks the output frequency of VCO 14 at the desired frequency, in this case $2^{27}$ Hz.

However, this application of prior art phase lock loop principles requires the use of a very low frequency (128 Hz) signal for phase comparison, which would prevent simultaneously meeting desired spurious signal and phase noise requirements. This is because the desired loop bandwidth for phase noise concerns is approximately 100 Hz, which is far too wide to filter spurious products from a phase detector working at 128 Hz. Furthermore, other components, such as dividers and phase detectors, have residual phase noise which is additive to the signal passing through them, independent of frequency. Since a signal's phase noise level is a function of frequency (if one scales frequency by "N", phase noise scales by 20 log N), it is necessary to keep the frequency of all signals high enough that the phase noise of the signal is not degraded by additive noise of the components (divider, phase detector, etc.). Preferably, the residual noise of components is not greater than approximately 10 dB less than the phase noise of the signals being manipulated. Using standard available dividers and phase detectors, this frequency level is at least about 10 MHz. For example, if one used a phase detector at 128 Hz to control an oscillator at $2^{27}$ Hz (134.217728 MHz), then the residual phase noise of the phase detector would be scaled up by 120 dB at the oscillator. Given the phase noise performance of any known phase detector, this would drastically degrade phase noise at the oscillator.

As an alternative to the structure of FIG. 1, a fractional N loop could be used to lock oscillator 11 and VCO 14 together, in order to cause VCO 14 to provide the desired output frequency. Two types of fractional "N" loops exist; one compensates for phase comparison errors to reduce the level of spurious signals and one does not. The uncompensated method will yield spurious signals at 128 Hz offsets which can only be filtered by using loop bandwidths which provide unacceptable phase noise. Thus, spurious signal and phase noise requirements cannot be simultaneously met. Using a compensated fractional N loop would allow a bandwidth that is good for phase noise, but with inadequate suppression of spurious signals. Such fractional "N" loops are described, for example, in "The Common Denominators in Fractional N", Hassun, Microwaves and RF, June 1984, pp. 107–110; "Frequency Domain Yields its Data to Phase-Locked Synthesizer", Gibbs et al., Electronics, Apr. 27, 1977, pp. 107–113; "VLF Output, Low Phase Noise Make Synthesizer Attractive Test Tool", Communications Designer's Digest, August, 1969, pp. 46–49; and "Low-Noise Frequency Synthesizers Using Fractional N Phase-Locked Loops", Rohde, R. F. Design, January/February 1981, pp. 20–34.

SUMMARY OF THE INVENTION

In accordance with the teachings of this invention, a unique method and structure is provided for phase locking an output signal having a desired frequency of $2^C$ Hz with a reference signal having a frequency of $2^A \cdot 5^B$ Hz. In accordance with the teachings of this invention, the phase comparison is performed at a high frequency in order to minimize phase noise and spurious output signals. In accordance with one embodiment of this invention, a $10^M$ Hz reference signal is used, together with appropriate dividers, multipliers, and mixers, to provide a signal having a selected frequency to a phase comparator. Similarly, the output signal from the voltage controlled oscillator is processed using appropriate dividers, multipliers, and mixers, to provide a signal to be applied to the phase detector which, when the output signal from the voltage controlled oscillator is at the desired frequency, has a frequency equal to the frequency of the signal applied to the phase comparator from the reference circuit. The phase comparator provides an error signal to the voltage controlled oscillator in order to cause the voltage controlled oscillator to provide an output signal of desired frequency.

BRIEF DESCRIPTION OF THE DRAWINGS

FIG. 3 is a plot of phase noise of a 134,217,728 Hz oscillator, a 10 MHz oscillator, and residual phase noise typical of phase detectors and/or digital frequency dividers;

FIG. 5-1 is a schematic diagram of one embodiment of a circuit which can perform a 3/125 mulitplication which is suitable for use in accordance with the teachings of this invention;

FIGS. 5-2a through 5-2f are timing diagrams of various signals in the circuit of FIG. 5-1;

FIG. 6-1 is a schematic diagram of one embodiment of a circuit which can perform a 3/128 frequency multiplication which is suitable for use in accordance with the teachings of this invention;

FIGS. 6-2a through 6-2c are timing diagrams of various signals in the circuit of FIG. 6-1.

DETAILED DESCRIPTION

Figure 2:
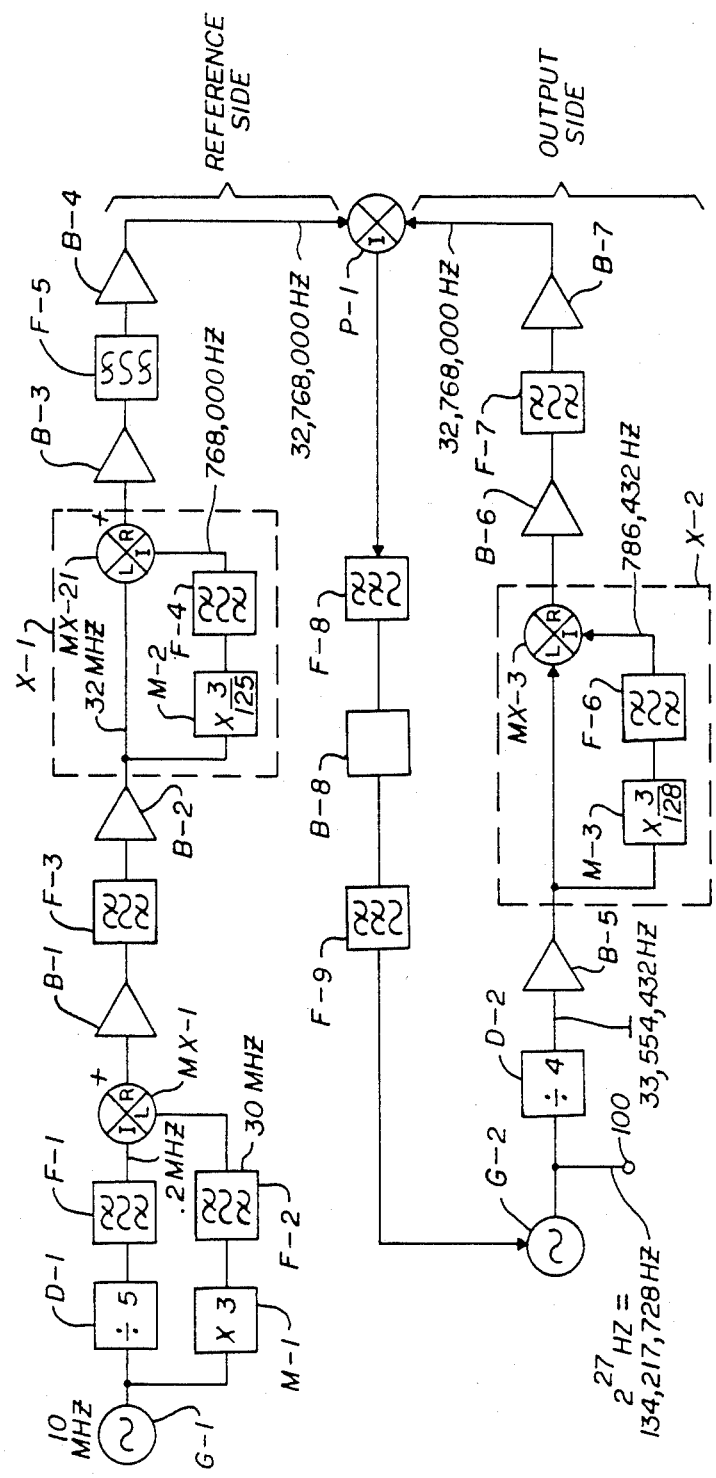
FIG. 2 is a block diagram of a circuit constructed in accordance with the teachings of this invention which is capable of providing an output signal of $2^C$ Hz based on a reference signal of $2^A \cdot 5^B$ Hz.

FIG. 2 shows a block diagram of a circuit constructed in accordance with one embodiment of this invention. Reference signal generator G-1 provides a 10 MHz reference signal. Divider D-1 divides the frequency of this 10 MHz signal by 5, and bandpass filter F-1 filters any undesired components, thereby providing a 2 MHz signal to mixer MX-1. Similarly, multiplier M-1 multiples the frequency of the 10 MHz signal from generator G-1 by 3, and bandpass filter F-2 removes undesired components, thereby providing a 30 MHz signal to mixer MX-1. Mixer MX-1 adds the 2 MHz signal from bandpass filter F-1 and the 30 MHz signal from bandpass filter F-2 and applies the result to amplifier B-1, bandpass filter F-3, and amplifier B-2, in order to provide a 32 MHz signal.

This 32 MHz signal is multiplied by a factor of 128/125 by block X-1 in the following manner. The frequency of the 32 MHz signal is multiplied by multiplier M-2 by a factor of 3/125 (described more fully later), and bandpass filter F-4 removes undesired components, thereby providing a 768,000 Hz signal to mixer MX-2. Mixer MX-2 adds the 32 MHz signal from buffer B-2 and the 768,000 Hz signal from bandpass filter F-4, and applies the result to amplifier B-3, bandpass filter F-5, and amplifier B-4, to provide a 32,768,000 Hz reference signal to phase detector P-1.

Similarly, voltage controlled crystal oscillator (VCXO) G-2 provides its output signal, which is desired to be 134,217,728 Hz, to divider D-2, which divides the frequency of the signal by 4, thereby providing a 33,554,432 Hz signal to amplifier B-5. This 33,554,432 Hz signal is multiplied by a factor of 125/128 by block X-2 in the following manner. Amplifier B-5 provides the 33,554,432 Hz signal to mixer MX-3 and to multiplier M-3, which multiplies its input frequency by a factor 3/128 and applies the result to bandpass filter F-6 to remove undesired components, which in turn provides a 786,432 Hz signal to mixer MX-3. Mixer MX-3 subtracts the 786,432 Hz signal from bandpass filter F-6 from the 33,554,432 Hz signal from amplifier B-5. The resultant 32,768,000 Hz signal is fed through amplifiers B-6, bandpass filter F-7, and amplifier B7 to phase detector P-1. Phase detector P-1 compares the phase of the signals received from buffer amplifiers B-4 and B-7 and provides an error signal via low pass filters F-8 and F-9 and loop filter/amplifier B-8 to VCXO G-2, in order to assure that the output signal from VCXO G-2 has the desired frequency of 134,217,728 Hz.

The phase noise performance of the generated signal (134,217,728 Hz) is a function of the phase noise of the reference signal provided by reference frequency generator G-1, the phase noise of the 134,217,728 Hz output signal produced by VCXO G-2, the bandwidth in which the two oscillators are phase locked together, and the residual noise added by dividers, mixers, amplifiers, phase detectors, etc. FIG. 3 shows a plot of phase noise vs. offset frequency from the carrier for a 10 MHz reference oscillator, for a 134,217,728 Hz VCXO, for a reasonable level of residual noise due to combination of residual noise sources. In order to compare phase noise, all signals must be referenced to the same frequency, which is chosen to be 32,768,000 Hz for FIG. 3. FIG. 3 shows the superior phase noise performance of the 10 MHz oscillator at low offset frequencies (less than approximately 100 Hz), and the superior phase noise performance of the 134,217,728 Hz VCXO at high offsets (greater than approximately 100 Hz). It is thus desirable to set phase lock loop bandwidth to 100 Hz. This gives the resultant signal the phase noise which is the composite of the best phase noise of each oscillator, with some degradation due to loop effects. The residual phase noise adds to the resultant phase noise described above. It is necessary to keep the residual phase noise approximately 10 dB below the phase noise of the oscillators within loop bandwidth to avoid degradation of the output signal phase noise. The dominant sources of residual noise in the embodiment of FIG. 2 are the frequency dividers D-1, D2, multipliers M-2, M-3, and phase detector P-1. FIG. 2 shows divider D-1, and multipliers M-2, M-3 have output frequencies which are 2 MHz or less, but all are up converted to the 30 MHz region, rather than multiplied. Consequently the effect is their noise appears additive at the 30 MHz region. Since noise of prior art phase detectors and dividers are fixed by available components, it is necessary to maintain the frequency of the signal at each point in the circuit sufficiently high, in order to minimize phase noise degradation of the output signal.

example, if it is desired to have a output frequency of $2^{26}$ Hz, $K_{output}$ would change by a factor of two, which can be easily implemented in the structure of FIG. 2, by changing divider D-2 from a divide by 4 divider to a divide by 2 divider. Alternatively, if it is desired to use a 5 MHz reference frequency, the reference frequency ratio $K_{output}$ will increase by a factor of 2, which can be implemented in the structure of FIG. 2 by placing a times 2 multiplier immediately following reference frequency generator G-1.

Also, in keeping with the spirit of this invention, the order of multiplication and division within the reference side and the output side of the structure of FIG. 2 can be changed, since doing so does not alter the reference

TABLE 1

| | | |
|---|---|---|
| Step 1 | Determine Reference Frequency as a power of two times a power of five | $F_{ref} = 10$ MHz $= 2^7 \times 5^7$ Hz |
| Step 2 | Determine Desired Output Frequency as a power of two | $F_{Output} = 134{,}217{,}728$ Hz $= 2^{27}$ Hz |
| Step 3 | Determine phase comparator frequency as a power of two times a power of five | $F_{phase} = 32{,}768{,}000$ Hz $= 2^{18} \times 5^3$ Hz |
| Step 4 | Determine reference frequency ratio | $F_{ref} \cdot K_{ref} = F_{phase}$ $K_{ref} = \dfrac{F_{phase}}{F_{ref}} = \dfrac{2^{18} \times 5^3}{2^7 \times 5^7} = \dfrac{2^{11}}{5^4}$ |
| Step 5 | Determine output frequency ratio | $F_{Output} \cdot K_{Output} = F_{phase}$ $K_{Output} = \dfrac{F_{phase}}{F_{output}} = \dfrac{2^{18} \times 5^3}{2^{27}} = \dfrac{5^3}{2^9}$ |

Table 1 shows the steps in the method of preparing a circuit for use in accordance with the teachings of this invention. As shown in Table 1, step 1 is to determine the reference frequency ($F_{ref}$) to be used, as a power of 2 times a power of 5. In the example given above with regard to FIG. 2, $F_{ref}$ equals 10 MHz, or $2^7 \times 5^7$ Hz. Step 2 is to determine the desired output frequency ($F_{output}$) as a power of 2. Again, in the example of FIG. 2, the output frequency equals 134,217,728 Hz, or $2^{27}$ Hz. Step 3 is to determine the phase comparator frequency ($F_{phase}$) as a power of 2 times a power of 5. As stated above, it is desired to have a high phase comparator frequency in order to minimize phase noise. Such a high phase comparator frequency is typically above about 10 MHz. In the example of FIG. 2, the frequency 32,768,000 Hz, which equals $2^{18} \times 5^3$ Hz, meets these requirements. It is to be understood that any convenient reference frequency, output frequency, and phase comparator frequencies can be used in accordance with the teachings of this invention.

Step 4 is to determine the reference frequency ratio ($K_{ref}$), i.e., that fraction by which the reference frequency is to be multiplied in order to derive the phase comparator frequency. In the example of FIG. 2 and Table 1, $K_{ref}$ is equal to $2^{11}/5^4$. Step 5 is to determine the output frequency ratio ($K_{output}$), i.e., that fraction by which the output frequency must be multiplied to obtain the phase comparator frequency. In the example of FIG. 2 and Table 1, $K_{output}$ equals $5^3/2^9$.

As shown in FIG. 2, the structure of this invention is then implemented, using the reference frequency ratio to multiply the reference frequency and the output frequency ratio to multiply the VCXO output frequency, both ratios being expressed as powers of 2 and powers of 5. Naturally, in accordance with the teachings of this invention, by changing either one or more of the reference frequency, output frequency, or phase comparator frequency, the reference frequency ratio and the output frequency ratio will be changed. For frequency ratio or the output frequency ratio. However, in this event, the frequencies of signals at various points in the reference side or the output side change, requiring appropriate changes in filter characteristics.

Figure 4:
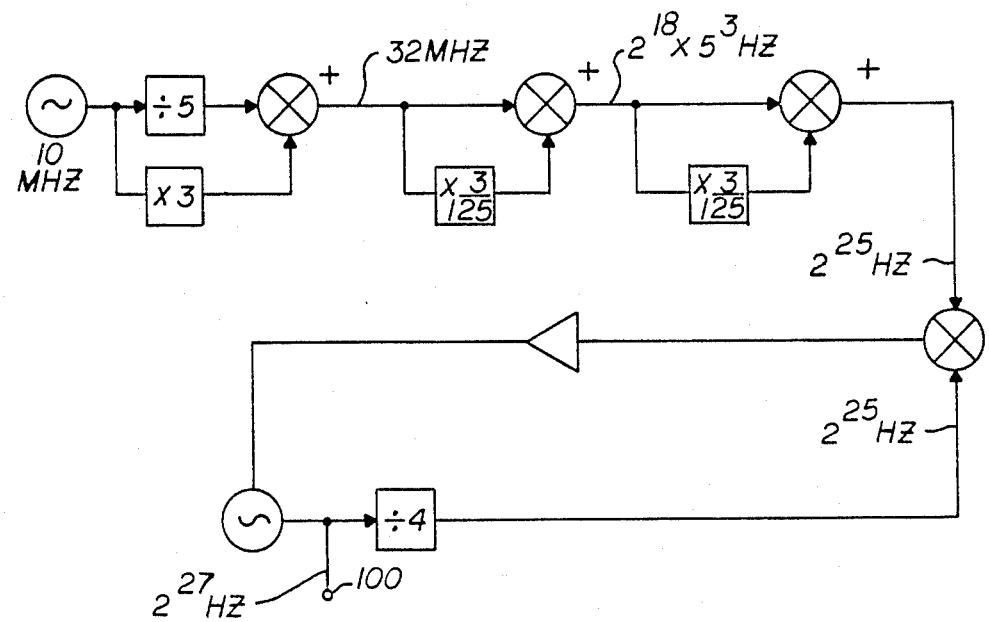
FIG. 4 is a block diagram of an alternative embodiment of this invention.

Also, in keeping with the spirit of this invention, a portion of either the output side or the reference side of the structure of FIG. 2 which multiplies by a factor X/Y can be moved to the opposite side of the phase detector if that portion were made to multiply by its reciprocal (Y/X). In this event, the reference frequency ratio, output frequency ratio, and the phase comparator frequency are changed such that the appropriate relationships between the reference frequency, output frequency, reference frequency ratio, output frequency ratio, and phase comparator frequency are maintained. This is shown in the example of FIG. 4, in which case the reference frequency remains at 10 MHz, the output frequency remains at $2^{27}$ Hz, but the phase comparator frequency becomes $2^{25}$ Hz.

As described above with reference to FIG. 2, multiplier M-2 multiplies a 32 MHz signal by a factor of 3/125, and multiplier M-3 multiplies a 33,554,432 Hz signal by a factor of 3/128. Multipliers M-2 and M-3 may be constructed as follows.

Figure 1:
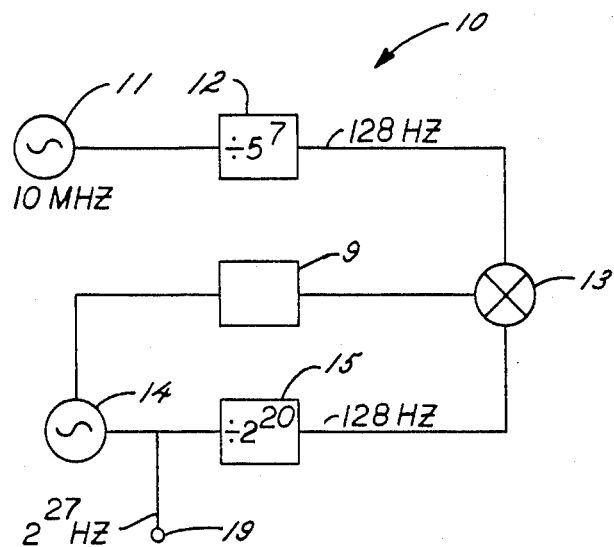
FIG. 1 is a block diagram of a typical prior art phase lock loop capable of generating a $2^C$ Hz signal from a $2^A \cdot 5^B$ Hz reference signal.

FIG. 5-1 is a schematic diagram of one embodiment of a circuit which can perform a 3/125 multiplication, and will be described now in conjuction with the timing diagrams of FIGS. 5-2a through 5-2f. The technique used in this example to multiply a 32 MHz signal by 3/125 first generates a signal having a frequency of 6/125 times the input frequency, and then divides this frequency by 2 in order to arrive at the 3/125 signal. This 6/125 waveform is shown in FIG. 5-2a. The first five cycles shown in FIG. 5-2a each contain 21 clock cycles of the 32 MHz input clock signal and the sixth cycle contains 20 clock cycles of the 32 MHz input clock signal. Referring to FIG. 5-1, the 32 MHz input signal is applied to U17 (MC12013). U17, together with one flip flop in U18 (a MC10H131 dual D flip-flop) form a dual modulus 20/21 counter. When the signal applied to lead 12 of U17A is brought low (logical 0), the dual modulus counter formed by U17A and U18 divide the input frequency by 21. Conversely, when lead 12 of U17 is brought high (logical 1), the dual modulus counter formed by U17A and U18 divides the input frequency by 20. Prescaler U25 (MC12009) is configured to count to six with a 50% duty cycle. Using D-type flip flop U18B and AND gate U26 (MC10H104), a control signal is provided to lead 12 of U17 which is high every sixth cycle of the output signal of the dual modulus counter formed by U17A and U18. Thus, FIG. 5-2a shows the output signal at Node A of FIG. 5-1. Similarly, FIG. 5-2b shows the inverted form of the signal of FIG. 5-2a which appears on Node B of FIG. 5-1. FIG. 5-2c is a waveform of the output signal of divide by six prescaler U25 (node C), which serves to drive one input lead of AND gate U26 and serves as the data input signal to D-type flip flop U18B. FIG. 5-2d is a waveform depicting the Q2 output signal (node D) of D-type flip flop U18B, and FIG. 5-2e is the inverse of FIG. 5-2d, i.e., the Q2 signal of flip flop U18B appearing at Node E. FIG. 5-2f is a waveform depicting the output signal of AND gate U26, which is the control signal applied to U17 to indicate when, on the sixth cycle of the signal of FIG. 5-2a, 20 clock cycles of the 32 MHz input clock are to be counted, rather than 21.

Refering to FIG. 5-1, the 6/125 signal appears at Node A, and is applied to flip flop U27 in order to be divided by two to provide 3/125 Q1 and Q1 differential ECL output signals from flip flop U27 (MC10H131), which are translated to a TTL level signal by ECL to TTL translater U17B. The 3/125 TTL output signal from U17B is latched into D-type flip flop U28 (SN74S74) using the 32 MHz input clock as a clocking signal applied to lead 3 of flip flop U28. Use of the 32 MHz clock signal to clock D-type flip flop U28 minimizes phase noise. The circuit of FIG. 5-1 includes a number of gates, which would each introduce phase noise or "jitter". By latching the output signal in D-type flip flop U28 using the 32 MHz clock signal, the only phase uncertainty is that of Schottky D-type flip flop U28 used to relatch the 3/125 signal.

Figures 1, 6:
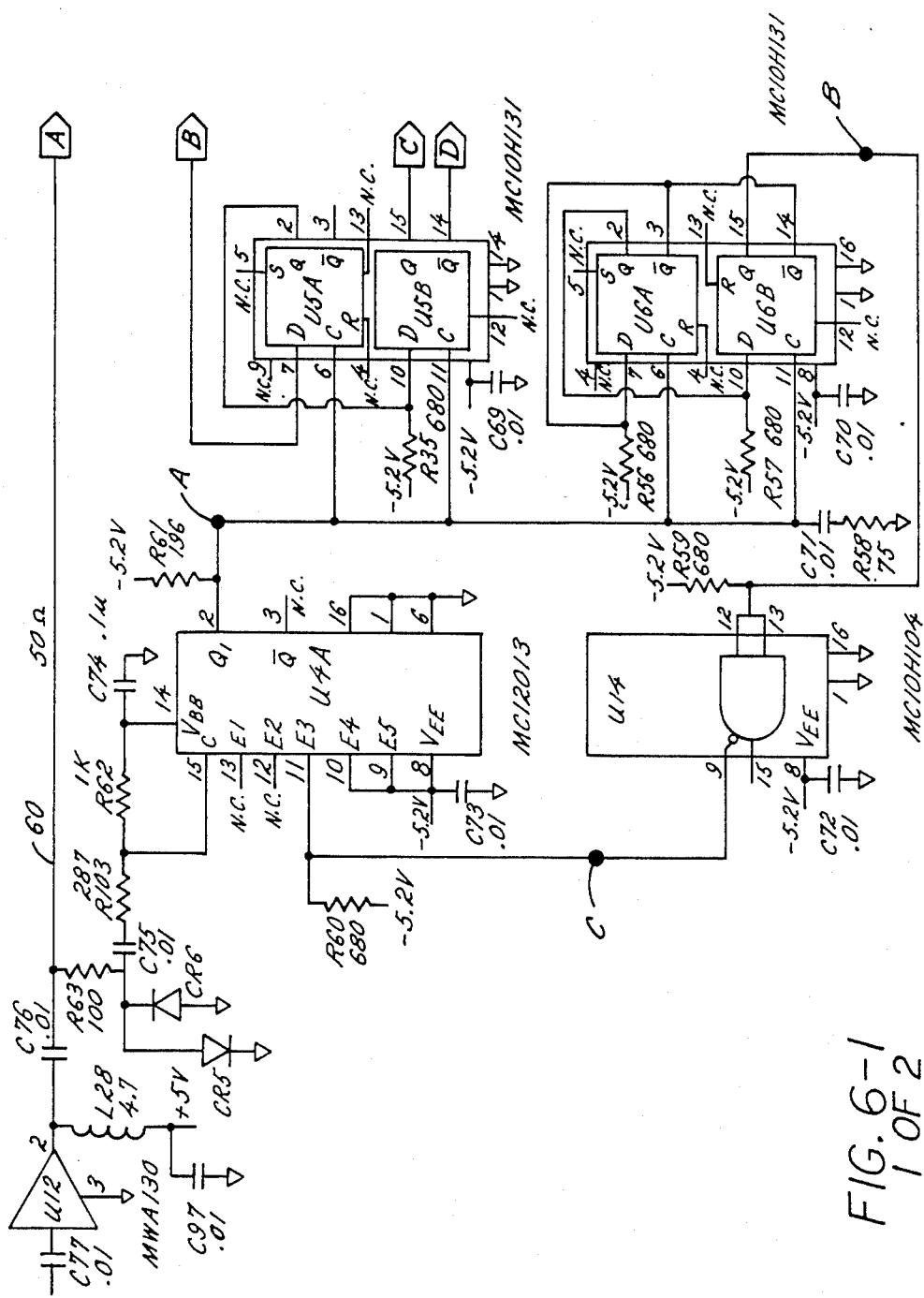

FIG. 6-1 is a schematic diagram of one embodiment of circuit X-2 of FIG. 2 which can provide an output signal having a frequency of 3/128 the frequency of the input signal. Since 128 is not evenly divisible by three, in order to generate three output cycles from 128 cycles of the input signal, the three output cycles are not the same length. As shown in FIG. 6-1, dual modulus 10/11 counter U4A (MC12013) is used to divide the input signal by 11 for two cycles and then by 10 to provide the third output cycle, as shown in FIG. 6-2a. This provides three output cycles for 32 input cycles or 12 output cycles for 128 input cycles. This 12/128 signal is then divided by four in order to provide the desired 3/128 output signal.

As shown in FIG. 6-1, U4 is a dual modulus 10/11 divider, and D-type flip flops U5A and U5B (MC10H131) are configured to divide the output frequency of U4 by four. D-type flip flops U6A and U6B (MC10H131) are configured to divide by three and provide the control signal such that dual modulus divider U4A divides by 10 on every third cycle, and divides by 11 on every first and second cycle. Gate U14 (MC10H104) serves to provide the appropriate polarity for the control signal to counter U4A. The output signal from D-type flip flop U5B is an ECL level signal, which is translated by ECL to TTL translator U4B to provide a TTL signal to D-type flip flop U13A. Flip flop U13A latches the output signal of the 3/128 circuit of FIG. 6-1, and is clocked by the original input clock signal on lead 60 in order to minimize phase noise, by eliminating from consideration the phase noise of the 3/128 circuitry. In this manner, the phase of the output signal multiplier depends only on the phase noise of the input clock signal and the phase noise introduced by D-type flip flop U13A which, in a prefered embodiment, is a Schottky flip flip, as Schottky gates have been measured to have low phase noise.

FIG. 6-2a is a timing diagram showing the output signal from U4A (node A) of FIG. 6-1. FIG. 6-2b is a diagram showing the Q output signal from counter U6B pin 15 (node B). FIG. 6-2c shows the output signal from NAND gate U14 (MC10H104) (node C), which is an inverted signal from the signal on node B. This signal on node C serves to control whether dual modulus divider U4A counts 11 or 10 cycles per divide operation.

Figure 7A:
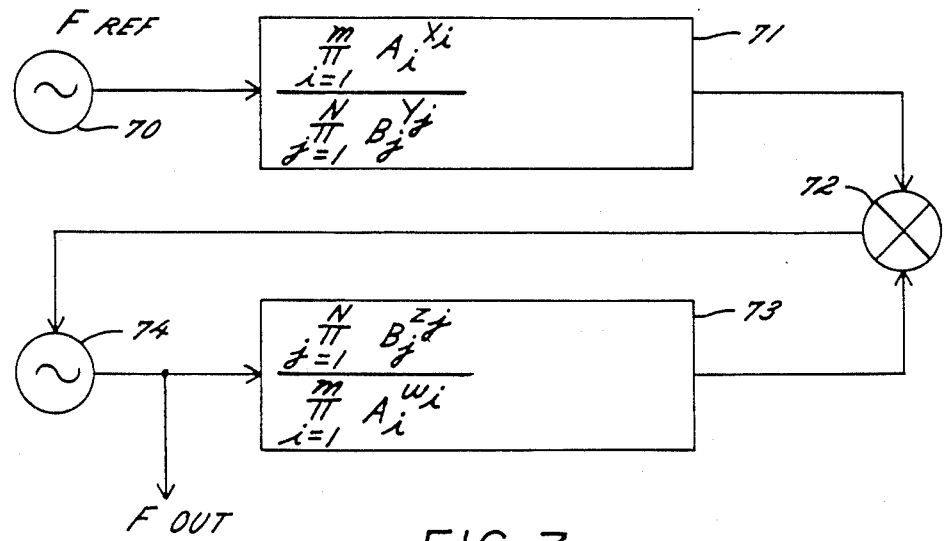
FIGS. 7a–7b are block diagrams of a more universal description of the teachings of this invention.

FIG. 7 shows a block diagram of a more general description of this invention. Reference oscillator 70 provides a reference frequency signal having reference frequency Fref, which is applied to multiplier device 71, which multiplies the frequency of the reference signal by a factor of $$\frac{M \atop \pi \ A_i \atop i=1}{N \atop \pi \ B_j \atop j=1} X_i \ \text{where:}$$

where:

M and N are positive integers;

$A_i$ are prime numbers;

$B_j$ are prime numbers;

$X_i$ and $Y_j$ are non-negative integers including zero.

This provides an intermediate signal to phase comparator 72. An output signal oscillator 74 provides an output signal having a frequency $F_{OUT}$ in response to an error signal provided by phase comparator 72. Device 73 serves to multiply the frequency $F_{OUT}$ by a factor of $$\frac{N \atop \pi \ B_j \atop j=1}{M \atop \pi \ A_i \atop i=1} Z_j \ \text{where:}$$

where:

M, N, $A_i$ and $B_j$ are the same as above and $Z_j$ and $W_i$ are non-negative integers including zero.

Figure 7B:
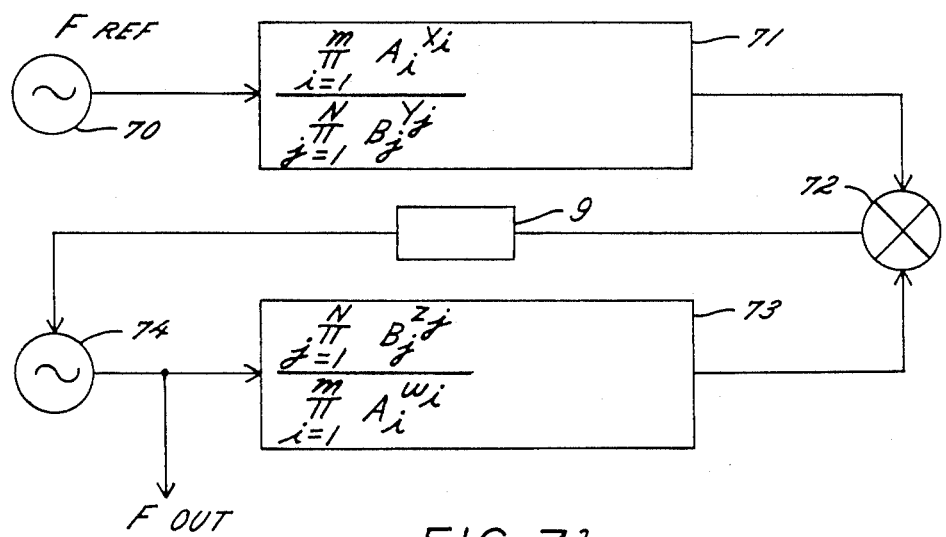

The output signal from device 73 is applied to phase comparator 72, which then compares the phase of the signals provided by devices 71 and 73 to provide the error signal which controls oscillator 74. An optional error amplifier/filter 9 may be inserted in the loop, as shown in FIG. 7b.

All publications and patent applications mentioned in this specification are indicative of the level of skill of those skilled in the art to which this invention pertains.

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A signal generator comprising: a reference signal means for providing a reference signal having a reference frequency equal to $2^A \cdot 5^B$ Hz, where A and B are integers greater than or equal to zero;

an output signal means for providing an output signal for said signal generator having an output frequency equal to $2^C$ Hz, where C is an integer greater than or equal to zero, the phase of said output signal being controlled by an error signal applied to said output signal means;

a phase comparator for comparing the phase of a first signal derived from said reference signal with the phase of a second signal derived from said output signal, and for providing said error signal to said output signal oscillator;

a first multiplication means for multiplying the frequency of said reference signal by a factor of $2^D/5^E$, where D and E are integers, and for providing said first signal having a frequency of $2^{A+D} \cdot 5^{B-E}$ Hz; and a second multiplication means for multiplying the frequency of said output signal by a factor of $5^F/2^G$, where F and G are integers, and for providing said second signal having a frequency of $2^{C-G}/5^F$ Hz.

2. A signal generator as in claim 1 wherein the frequencies of said first and second signals are related by an integer factor.

3. A signal generator as in claim 2 wherein said first and second signals have a frequency greater than said reference frequency.

4. A signal generator as in claim 2 wherein one or both of said first and second signals have a frequency less than said reference frequency.

5. A signal generator as in claim 2 wherein one or both of said first and second signals have a frequency less than said output frequency.

6. A signal generator as in claim 2 wherein one or both of said first and second signals have a frequency greater than said output frequency.

7. A signal generator as in claim 3 wherein said first and second signals have a frequency greater than approximately 10 MHz.

8. A signal generator as in claim 1 wherein the phase noise of said output signal is not significantly degraded by residual noise of said first and second multiplication means and said phase comparator.

9. A signal generator as in claim 1 wherein said first multiplication means includes means for multiplying frequency by $2^H/5^I$, where H and I are integers, comprising means for multiplying a selected frequency by $(2^H \pm 5^I)/5^I$ and means for adding or subtracting said selected frequency and the output frequency of said means for multiplying said selected frequency by $(2^H \pm 5^I)/5^I$.

10. A signal generator as in claim 9 wherein said first multiplication means includes means for multiplying frequency by 128/125 comprising means for multiplying a selected frequency by 3/125 and means for adding said selected frequency and the output frequency of said means for multiplying said selected frequency by 3/125.

11. A signal generator as in claim 10 wherein said means for multiplying a selected frequency by 3/125 comprises:

a dual modulus 20/21 divider; means for controlling said dual modulus 20/21 divider to count 21 cycles of said selected frequency during each of a first through fifth phases, and to count 20 cycles of said selected frequency during a sixth phase, thereby providing an intermediate frequency signal having six cycles for 125 cycles of said selected frequency; and means for dividing said intermediate frequency signal by 2, in order to provide a signal having a frequency of 3/125 times said selected frequency.

12. A signal generator as in claim 11 wherein said means for multiplying includes a means for latching the output signal of said means for multiplying with a signal of a selected frequency in order to reduce the phase noise of said output signal of said means for multiplying.

13. A signal generator as in claim 1 wherein said second multiplication means includes means for multiplying frequency by $5^J/2^K$, where J and K are integers, comprising means for multiplying a selected frequency by $2^K \pm 5^J)/2^K$ and means for adding or subtracting said selected frequency and the output frequency of said means for multiplying said selected frequency by $(2^K \pm 5^J)/2^K$.

14. A signal generator as in claim 13 wherein said second multiplication means includes means for multiplying frequency by 125/128 comprising means for multiplying a selected frequency by 3/128 and means for subtracting said selected frequency and the output frequency of said means for multiplying said selected frequency by 3/128.

15. A signal generator as in claim 14 wherein said means for multiplying a selected frequency by 3/128 comprises:

a dual modulus 10/11 divider;

means for controlling said dual modulus 10/11 divider to count 11 cycles of said selected frequency during a first phase, to count 11 cycles of said selected frequency during a second phase, and to count 10 cycles of said selected frequency during a third phase, thereby providing an intermediate frequency signal having three cycles for 32 cycles of said selected frequency; and means for dividing said intermediate frequency signal by 4, in order to provide a signal having a frequency of 3/128 times said selected frequency.

16. A signal generator as in claim 14 wherein said means for multiplying includes means for latching the output signal of said means for multiplying with a signal of a selected frequency in order to reduce the phase noise of said output signal of said means for multiplying.

17. A method for generating an output signal having a frequency equal to $2^C$ Hz which is phase locked to a reference signal having a reference frequency of $2^A \cdot 5^B$ Hz, where A, B, and C are integers greater than or equal to zero, comprising the steps of:

determining the reference frequency as a power of two times a power of five;

determining the desired output frequency as a power of two;

selecting the phase comparator frequency as a power of two times a power of five;

determining the reference frequency ratio as that value by which said reference frequency must be multiplied in order to derive said phase comparator frequency;

determining the output frequency ratio as that value by which said desired output frequency must be multiplied in order to derive said phase comparator frequency;

using said reference frequency ratio to derive said phase comparator frequency from said reference frequency, and applying said derived signal to a phase comparator;

using said output frequency ratio to derive said phase comparator frequency from said output frequency, and applying said derived signal to said phase comparator; and applying an error signal from said phase comparator to an oscillator for generating said output frequency.

18. An apparatus for providing an output signal comprising:

a first oscillator means for providing a reference signal;

a second oscillator means for providing said output signal in response to an error signal;

a first converter means for converting said reference signal to a first signal, wherein said reference signal is related to said first signal by a first factor having a numerator and a denominator;

a second converter means for converting said output signal to a second signal, wherein said output signal is related to said second signal by a second factor having a numerator and a denominator, wherein said first and second signals are related by an integer factor; and a detector means for comparing said first and second signals to provide said error signal, wherein said numerator of said first factor and said denominator of said second factor are formed by the product of a first set of one or more prime numbers raised to integer powers; and wherein said denominator of said first factor and said numerator of said second factor are formed by the product of a second set of one or more prime numbers raised to integer powers.

19. An apparatus as in claim 18 wherein said first factor is expressed as:

$$\frac{\prod_{i=1}^{M} A_i^{X_i}}{\prod_{j=1}^{N} B_j^{Y_j}}$$

and said second factor is express as:

$$\frac{\prod_{j=1}^{N} B_j^{Z_j}}{\prod_{i=1}^{M} A_i^{W_i}} \text{ where:}$$

where:

M and N are positive integers, $A_i$ are prime numbers;

$B_j$ are prime numbers;

$X_i$, $Y_j$, $Z_j$, and $W_i$ are non-negative integers including zero.

20. An apparatus as in claim 19 wherein $A_i$ are the prime numbers of said output signal when said output signal is expressed as a product of powers of prime numbers.

21. An apparatus as in claim 19 wherein $B_j$ are the prime numbers of said reference signal when said reference signal is expressed as a product of powers of prime numbers.

22. An apparatus as in claim 19 wherein said first and second converter means comprise elements selected from the group of elements consisting of frequency multipliers, frequency dividers, frequency adders, and frequency subtractors.

* * * * *

UNITED STATES PATENT AND TRADEMARK OFFICE
CERTIFICATE OF CORRECTION

PATENT NO. :   4,745,373

DATED      :   May 17, 1988

INVENTOR(S) :  Stuart Carp & William Cornelius

It is certified that error appears in the above-identified patent and that said Letters Patent is hereby corrected as shown below:

Column 7, Line 24, "Q2 signal" should read --- $\overline{Q2}$ signal ---;

Column 7, Line 32, "Q1 differential" should read --- $\overline{Q1}$ differential ---;

Column 8, Line 57/58, "where" should be deleted.

Signed and Sealed this

Twelfth Day of February, 1991

Attest:

HARRY F. MANBECK, JR.

*Attesting Officer*      Commissioner of Patents and Trademarks